US011665848B2

(12) United States Patent
Wang

(10) Patent No.: US 11,665,848 B2
(45) Date of Patent: May 30, 2023

(54) TRAY AND ELECTRONIC DEVICE

(71) Applicant: Wistron Corporation, New Taipei (TW)

(72) Inventor: Jun-Hao Wang, New Taipei (TW)

(73) Assignee: Wistron Corporation, New Taipei (TW)

( * ) Notice: Subject to any disclaimer, the term of this patent is extended or adjusted under 35 U.S.C. 154(b) by 135 days.

(21) Appl. No.: 17/373,791

(22) Filed: Jul. 13, 2021

(65) Prior Publication Data

US 2022/0377926 A1 Nov. 24, 2022

(30) Foreign Application Priority Data

May 24, 2021 (CN) .......................... 202110567672.0

(51) Int. Cl.
| | |
|---|---|
| H05K 7/00 | (2006.01) |
| H05K 7/14 | (2006.01) |
| H05K 5/02 | (2006.01) |
| G06F 1/18 | (2006.01) |

(52) U.S. Cl.
CPC ........... H05K 7/1489 (2013.01); H05K 5/023 (2013.01); *G06F 1/184* (2013.01)

(58) Field of Classification Search
CPC .. H05K 7/1489; H05K 7/1487; H05K 7/1417; H05K 7/1409; H05K 7/1488; H05K 5/023; G06F 1/184; G06F 1/183; G06F 1/187
USPC ................. 312/330.1, 223.2, 332.1; 361/726
See application file for complete search history.

(56) References Cited

U.S. PATENT DOCUMENTS

| | | | |
|---|---|---|---|
| 10,251,300 B1 | 4/2019 | Mao | |
| 10,863,644 B1 * | 12/2020 | Tseng | ................... H05K 7/1487 |
| 10,888,025 B2 * | 1/2021 | Wu | ...................... H05K 7/1487 |
| 11,310,932 B2 * | 4/2022 | Chang | ..................... H05K 7/16 |
| 2018/0157295 A1 | 6/2018 | Zhu et al. | |
| 2020/0396859 A1 * | 12/2020 | Liu | ...................... G11B 33/128 |
| 2022/0369492 A1 * | 11/2022 | Zhang | ................. H05K 7/1489 |
| 2022/0377926 A1 * | 11/2022 | Wang | .................. H05K 7/1489 |
| 2022/0386497 A1 * | 12/2022 | Wang | .................. H05K 7/1489 |
| 2023/0049413 A1 * | 2/2023 | Tan | ...................... H05K 7/1489 |

FOREIGN PATENT DOCUMENTS

| | | | |
|---|---|---|---|
| CN | 108508980 | * | 9/2018 |
| TW | 202001483 | | 1/2020 |

OTHER PUBLICATIONS

English translation CN 108508980 (Year: 2018).*
"Office Action of Taiwan Counterpart Application", dated Sep. 5, 2022, p. 1-p. 13.

* cited by examiner

*Primary Examiner* — Janet M Wilkens
(74) *Attorney, Agent, or Firm* — JCIPRNET

(57) ABSTRACT

A tray is detachably assembled to a chassis. The chassis includes a first chassis guide post. The tray includes a tray body, a handle and a first sliding piece. The tray body includes a side wall and a through slot disposed on the side wall. The handle is pivotally connected to the side wall and includes a handle guide post. The first sliding piece includes a first groove and a second groove. The handle guide post is disposed in the through slot and the first groove. The first chassis guide post is detachably disposed in the second groove.

20 Claims, 17 Drawing Sheets

TRAY AND ELECTRONIC DEVICE

CROSS-REFERENCE TO RELATED APPLICATION

This application claims the priority benefit of China application serial no. 202110567672.0, filed on May 24, 2021. The entirety of the patent application is hereby incorporated by reference herein and made a part of this specification.

BACKGROUND

1. Technical Field

The disclosure relates to a tray and an electronic device, and particularly relates to a tray with a handle and an electronic device with the tray.

2. Description of Related Art

At present, some servers are provided with a tray in the chassis, and the tray is separated from the baseboard of the chassis by a distance. The motherboard may be disposed on the baseboard of the chassis, and another circuit board may be disposed on the tray. Signals can be transmitted between the motherboard and the circuit board through connectors or cables. How to make tray simply and easily assemble to and disassemble from the chassis is the current research direction.

SUMMARY

The disclosure provides a tray, which can be easily assembled to and disassembled from the chassis.

The disclosure provides an electronic device having the tray described above.

A tray of the disclosure is detachably assembled to a chassis. The chassis includes a first chassis guide post, and the tray includes a tray body, a handle, and a first sliding piece. The tray body includes a side wall and a through slot on the side wall. The handle is pivotally connected to the side wall and includes a handle guide post. The first sliding piece is movably disposed on the side wall and includes a first groove and a second groove. The handle guide post is disposed in the through slot and the first groove, and the first chassis guide post is detachably disposed in the second groove.

An electronic device of the disclosure includes a chassis and a tray. The chassis includes a first chassis guide post. The tray is detachably disposed in the chassis and includes a tray body, a handle and a first sliding piece. The tray body includes a side wall and a through slot disposed on the side wall. The handle is pivotally connected to the side wall and includes a handle guide post. The first sliding piece is movably disposed on the side wall and includes a first groove and a second groove. The handle guide post is disposed in the through slot and the first groove, and the first chassis guide post is detachably disposed in the second groove.

In an embodiment of the disclosure, the handle has a vertical state and a horizontal state. When the handle is in the vertical state, the handle guide post of the handle is located at an end of the through slot close to a lower edge of the first sliding piece. When the handle is in the horizontal state, the handle guide post of the handle is located at another end of the through slot away from the lower edge of the first sliding piece.

In an embodiment of the disclosure, the first groove of the first sliding piece extends along a first axis, the second groove includes a horizontal section extending along a second axis, an inclined section extending from the lower edge of the first sliding piece, and an opening; the opening is provided at the lower edge of the first sliding piece at the inclined section, and the inclined section has a distance difference in a first axis direction.

In an embodiment of the disclosure, when the tray is disposed on the chassis, the handle is in a vertical state, and the first chassis guide post is disposed in the opening of the second groove.

In an embodiment of the disclosure, when the handle is rotated from the vertical state to the horizontal state, the first chassis guide post moves, through the opening, from the inclined section to the horizontal, such that the first sliding piece moves along the second axis, and the tray moves toward the chassis along the first axis direction.

In an embodiment of the disclosure, the sliding piece includes a first abutting element, and the chassis includes a first positioning member. When the handle is in the horizontal state, the first chassis guide post is located in the horizontal section, and the first abutting element abuts against the first positioning member of the chassis.

In an embodiment of the disclosure, the tray body includes a first tray body guide post protruding from the side wall, the first sliding piece includes a third groove, and the first tray body guide post is sleeved in the third groove, such that first sliding piece is movably disposed on the side wall.

In an embodiment of the disclosure, the tray further includes a connecting element and a second sliding piece. The connecting element is pivoted on the side wall. The second sliding piece is movably disposed on the side wall, and the connecting element is disposed between the first sliding piece and the second sliding piece, such that the first sliding piece is connected with the second sliding piece.

In an embodiment of the disclosure, the connecting element includes a gear, the first sliding piece includes a first rack, the second sliding piece includes a second rack, and the gear is engaged with the first rack and the second rack.

In an embodiment of the disclosure, the connecting element includes a connecting rod, and the connecting rod includes a connecting rod groove and a connecting rod guide post. The first sliding piece includes a sliding piece guide post disposed in the connecting rod groove, the second sliding piece includes a fifth groove, and the connecting rod guide post is disposed in the fifth groove.

In an embodiment of the disclosure, the tray body includes a second tray body guide post protruding from the side wall, the second sliding piece includes a fourth groove, and the second tray body guide post is sleeved in the fourth groove, such that the second sliding piece is movably disposed on the side wall.

In an embodiment of the disclosure, the first sliding piece includes a first abutting element, the second sliding piece includes a second abutting element, and the chassis includes a first positioning member and a second positioning member. When the handle is in the horizontal state, the first abutting element and the second abutting element abut against the first positioning member and the second positioning member of the chassis, respectively.

In an embodiment of the disclosure, one of the handle and the side wall includes a bump, and the other of the handle and the side wall includes a locking hole corresponding to the bump.

In an embodiment of the disclosure, the chassis includes a second chassis guide post, the tray includes a guiding groove protruding from the side wall, and the second chassis guide post is sleeved in the guiding groove. A tray of the disclosure includes a tray body, a handle, a first sliding piece, a connecting element, and a second sliding piece. The tray body includes a side wall and a through slot on the side wall. The handle is pivotally connected to the side wall and includes a handle guide post. The first sliding piece is movably disposed on the side wall and includes a first groove. The connecting element is pivoted on the side wall. The second sliding piece is movably disposed on the side wall. The handle guide post is disposed in the through slot and the first groove, and the connecting element is disposed between the first sliding piece and the second sliding piece, such that the first sliding piece is connected with the second sliding piece.

Based on the above, the first sliding piece of the tray of the disclosure is movably disposed on the side wall of the tray body, the handle is pivotally connected to the side wall of the tray body, and the handle guide post is disposed in the through slot of the tray body and the first groove of the sliding piece. Therefore, when the handle rotates relative to the side wall of the tray body, the handle guide post may be pushed against the wall surface of the first groove in the first sliding piece, such that the first sliding piece moves relative to the side wall of the tray body. When the tray is disposed on the chassis, the first chassis guide post is detachably disposed in the second groove. During the movement of the first sliding piece relative to the side wall of the tray body, the inner edge of the second groove is matched with the first chassis guide post, such that the tray is dissembled in chassis. Similarly, rotating the handle in the opposite direction may move the tray out of the chassis. Therefore, the tray of the disclosure can be easily assembled to and disassembled from the chassis.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
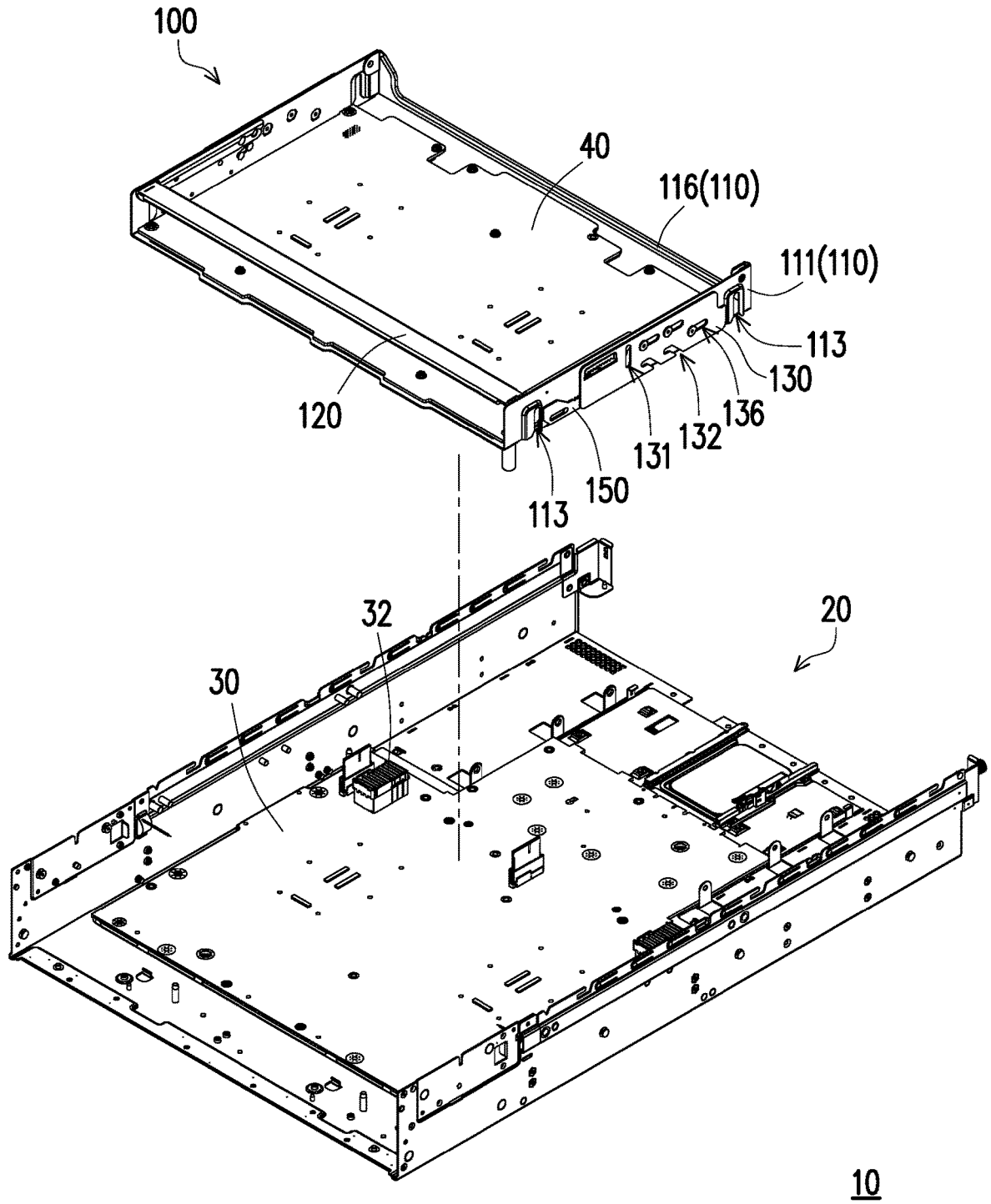
FIG. 1A is a three-dimensional schematic view of an electronic device with a tray separated from a chassis according to an embodiment of the disclosure.

Reference will now be made in detail to the exemplary embodiments of the disclosure, examples of which are illustrated in the accompanying drawings. Wherever possible, the same reference numbers are used in the drawings and the description to refer to the same or like parts.

Figure 1B:
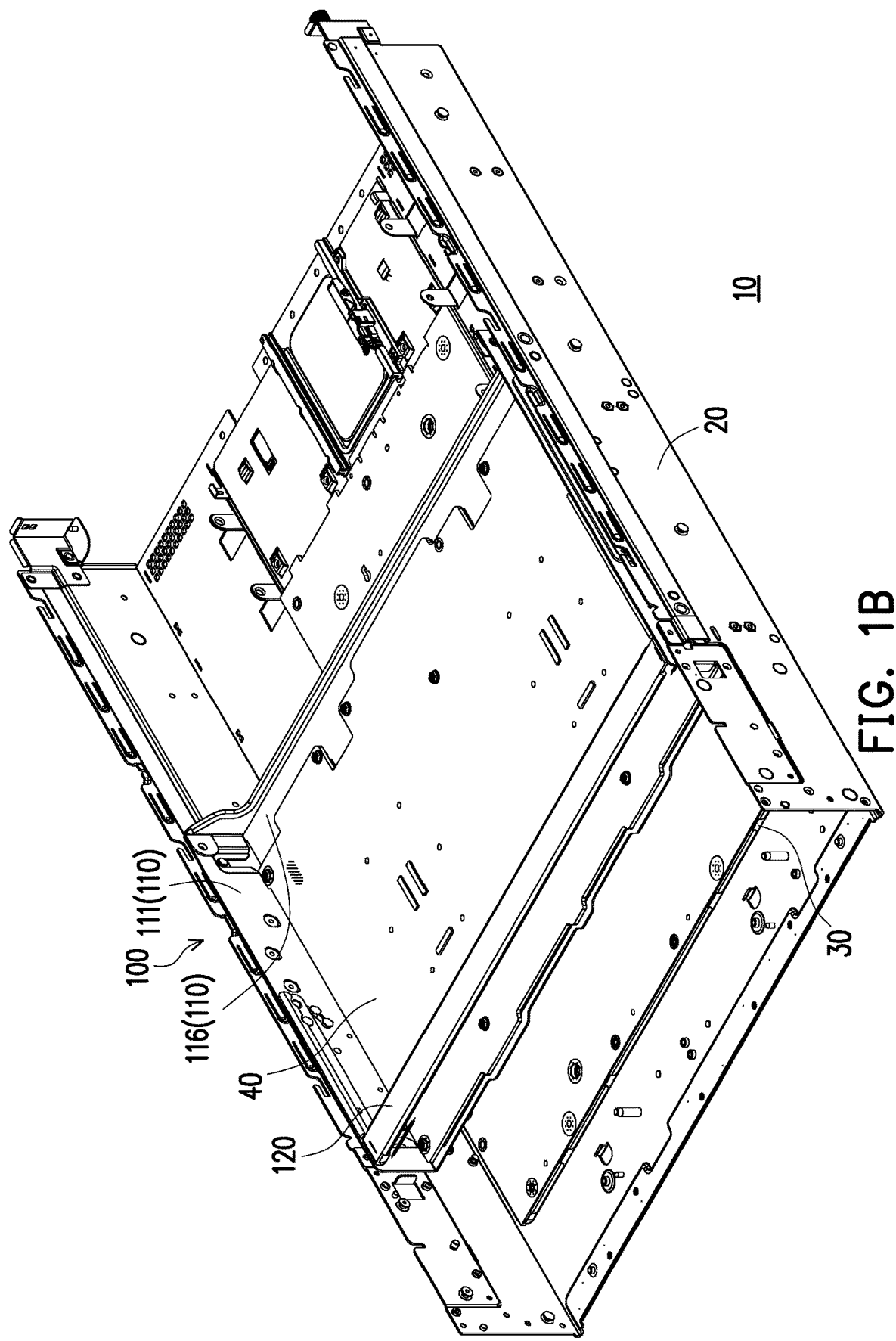
FIG. 1B is a three-dimensional schematic view of the tray of the electronic device of FIG. 1A dissembled in the chassis.

FIG. 1A is a three-dimensional schematic view of an electronic device with a tray separated from a chassis according to an embodiment of the disclosure. FIG. 1B is a three-dimensional schematic view of the tray of the electronic device of FIG. 1A assembled to the chassis. With reference to FIG. 1A and FIG. 1B, an electronic device 10 of the present embodiment may be, for example, a server, but the type of the electronic device 10 is not limited thereto. The electronic device 10 includes a chassis 20 and a tray 100 detachably disposed in the chassis 20.

It may be seen from FIG. 1A that a motherboard 30 may be assembled to the chassis 20, and a circuit board 40 may be assembled to the tray 100. As shown in FIG. 1B, in the electronic device 10, the chassis 20 may be divided into an upper layer and a lower layer by disposing the tray 100, such that the space in the chassis 20 can be fully utilized. A tray body 110 may be configured to carry the circuit board 40 (FIG. 1A) or a hard disk (not shown). In the present embodiment, when the tray 100 is assembled to the chassis 20, the circuit board 40 on the tray 100 may be electrically connected to the motherboard 30 in the chassis 20 for signal transmission.

In the present embodiment, the tray 100 may be assembled to the chassis 20 in a very convenient and labor-saving manner, as explained below.

Figure 2A:
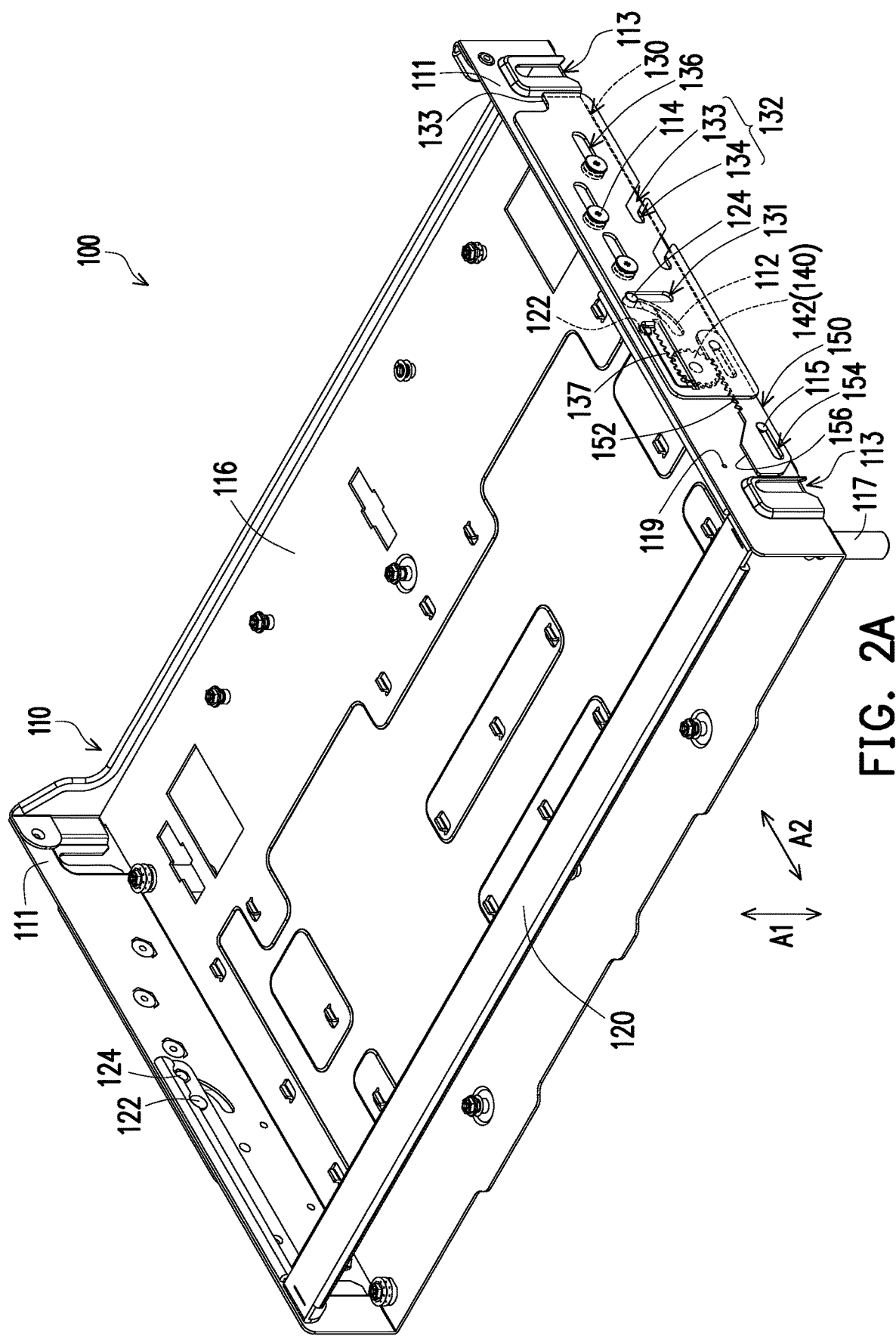
FIG. 2A is a three-dimensional schematic view of the tray of the electronic device of FIG. 1A.
Figure 2B:
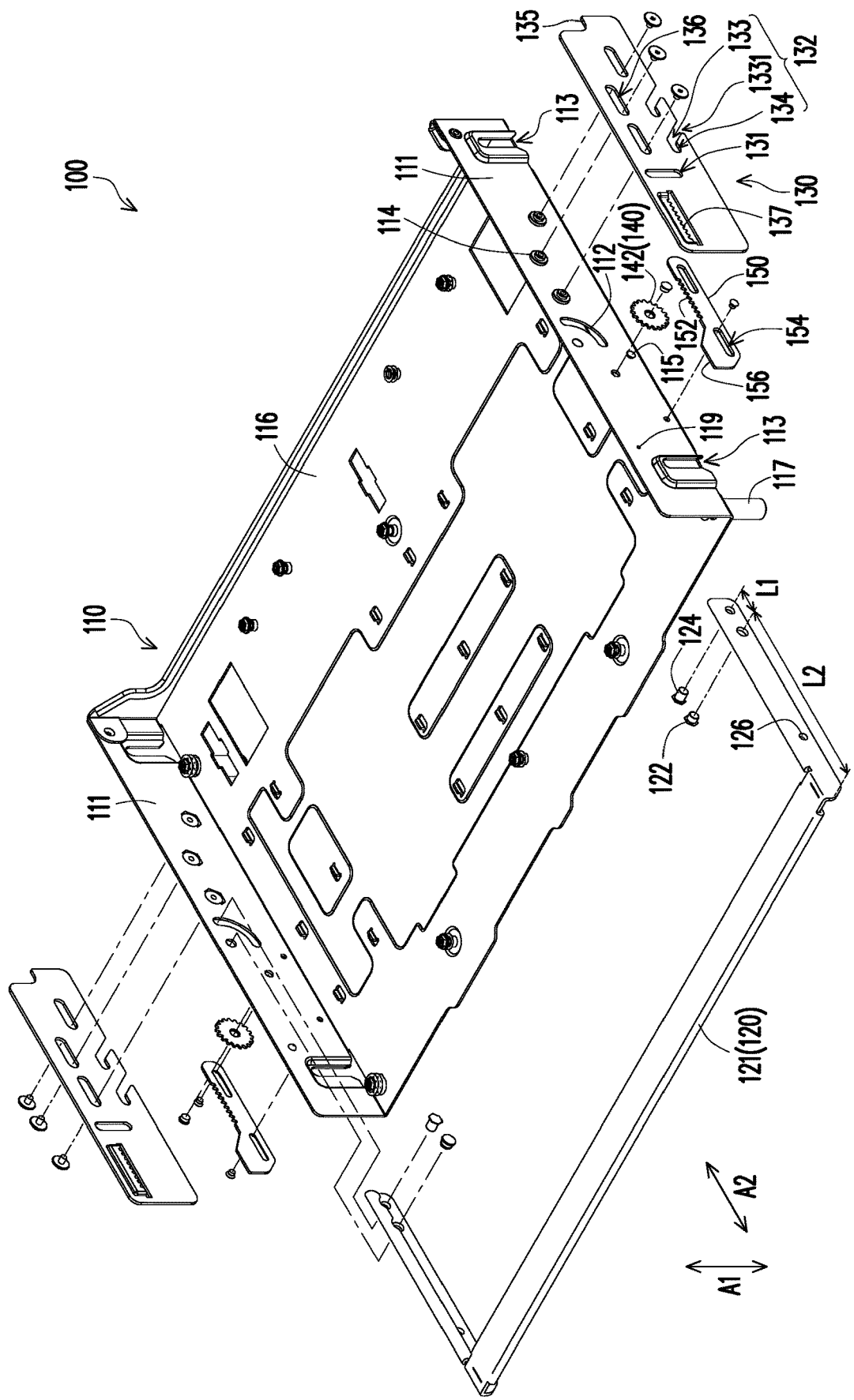
FIG. 2B is an exploded schematic view of FIG. 2A.

FIG. 2A is a three-dimensional schematic view of the tray of the electronic device of FIG. 1A. FIG. 2B is an exploded schematic view of FIG. 2A. With reference to FIGS. 2A and 2B, the tray 100 includes the tray body 110, a handle 120, and at least one first sliding piece 130. It should be noted that in the present embodiment, two first sliding pieces 130 are symmetrically disposed on two sides of the tray body 110, and the relative relationship between only one of the first sliding pieces 130 and the tray body 110 will be described below.

As shown in FIG. 2B, the tray body 110 includes a bottom wall 116, at least one side wall 111 (such as two opposite side walls 111) connected to the bottom wall 116, a through slot 112 located on each side wall 111, and at least one first tray body guide post 114 protruding from each side wall 111. In some embodiments, the through slot 112 may be arc-shaped. Moreover, the tray body 110 may further include a guiding groove 113 extending from a lower edge of the side wall 111, and the guiding groove 113 extends along a first axis A1.

The handle 120 includes an operating end 121, and a pivot member 122 and a handle guide post 124 away from the operating end 121. The handle 120 is pivotally connected to the side wall 111 through the pivot member 122. The handle guide post 124 and the operating end 121 of the handle 120 (FIG. 2B) are located on opposite sides of the pivot member 122, and a distance L1 between the handle guide post 124 and the handle 120 is smaller than a distance L2 between the operating end 121 and the handle 120.

The first sliding piece 130 includes a second groove 132, a first groove 131 extending along the first axis A1, and a third groove 136 extending along a second axis A2. The second groove 132 includes an inclined section 133 extending from a lower edge of the first sliding piece 130, a horizontal section 134 extending along the second axis A2, and an opening 1331. The opening 1331 is provided at the lower edge of the first sliding piece 130 at the inclined section 133. The inclined section 133 has an angular relationship with the first axis A1. One end of the inclined section 133 is close to the pivot member 122 of the handle 120 and away from the bottom wall 116 of the tray, and the other end of the inclined section 133 is away from the pivot member 122 of the handle 120 and close to the bottom wall 116 of the tray 100. The two ends of the inclined section 133 have a distance difference from the first axis A1.

It may be seen from FIG. 2A that the handle guide post 124 is disposed in the through slot 112 of the side wall 111 and extends into the first groove 131 of the first sliding piece 130. The rotatable angle of the handle 120 is limited by the angle of the through slot 112. Moreover, the first tray body guide post 114 of the tray body 110 is disposed in the third groove 136 of the first sliding piece 130, such that the first sliding piece 130 is movably disposed on the side wall 111 along the second axis A2.

Furthermore, in the present embodiment, the tray 100 may further optionally include a connecting element 140 and a second sliding piece 150. The second sliding piece 150 includes a fourth groove 154 extending along the second axis A2. The tray body 110 includes a second tray body guide post 115 protruding from the side wall 111, and the second tray body guide post 115 of the tray body 110 is disposed in the fourth groove 154 of the second sliding piece 150, such that the second sliding piece 150 is movably disposed on the side wall 111 along the second axis A2.

The connecting element 140 is pivoted on the side wall 111. The connecting element 140 is disposed between the first sliding piece 130 and the second sliding piece 150, such that the first sliding piece 130 is connected with the second sliding piece 150. Specifically, in the present embodiment, the connecting element 140 includes a gear 142, the first sliding piece 130 includes a first rack 137, and the second sliding piece 150 includes a second rack 152. The gear 142 is engaged with the first rack 137 and the second rack 152, and the first rack 137 and the second rack 152 are located on opposite sides of the gear 142.

The movement process of the first sliding piece 130 and the second sliding piece 150 relative to the tray body 110 during the rotation of the handle 120 of the tray 100 from the vertical state to the horizontal state will be described.

Figure 2C:
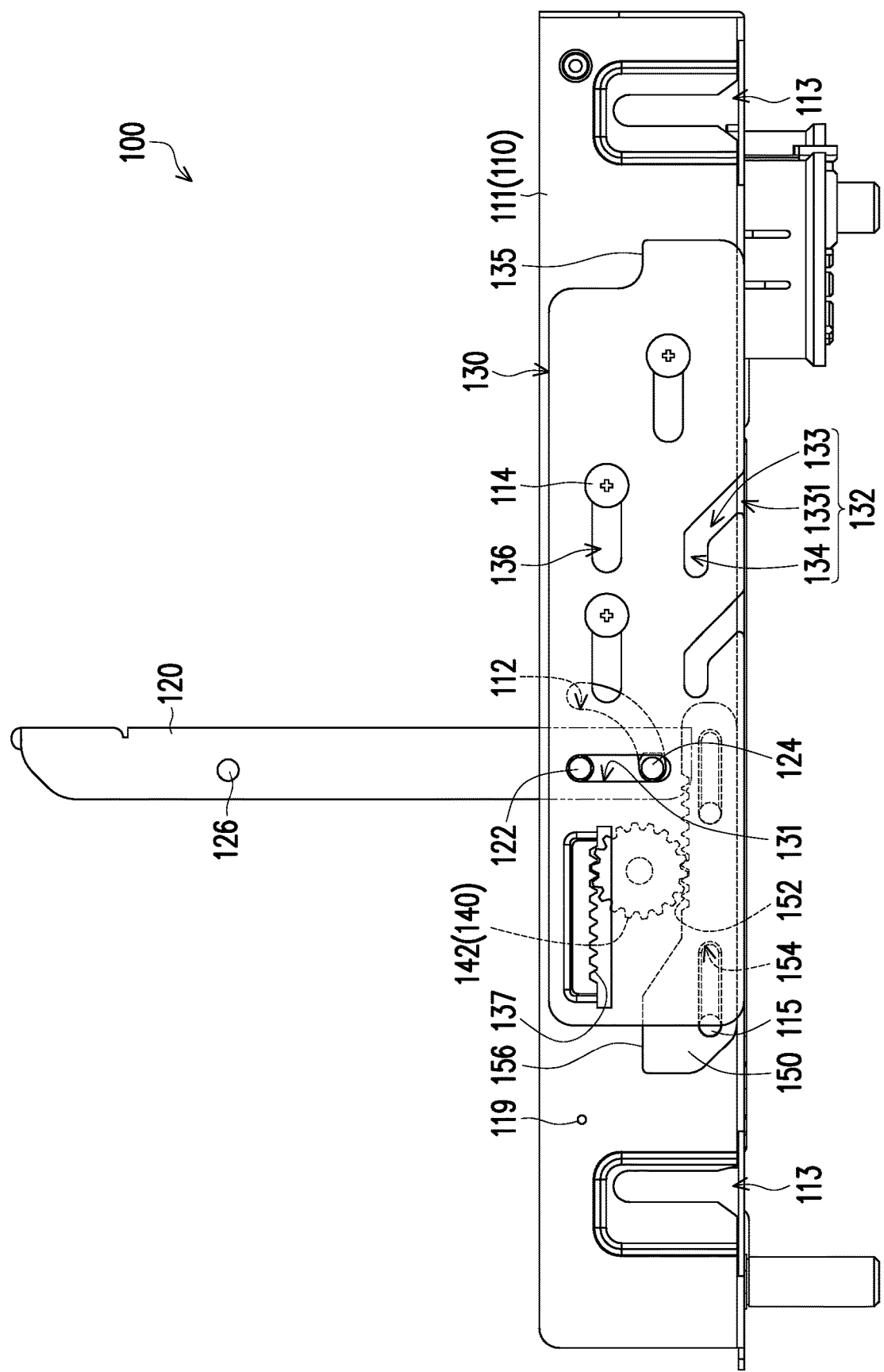
FIGS. 2C to 2E are side views of the handle of the tray of FIG. 2A rotating from vertical to horizontal.
Figure 2D:
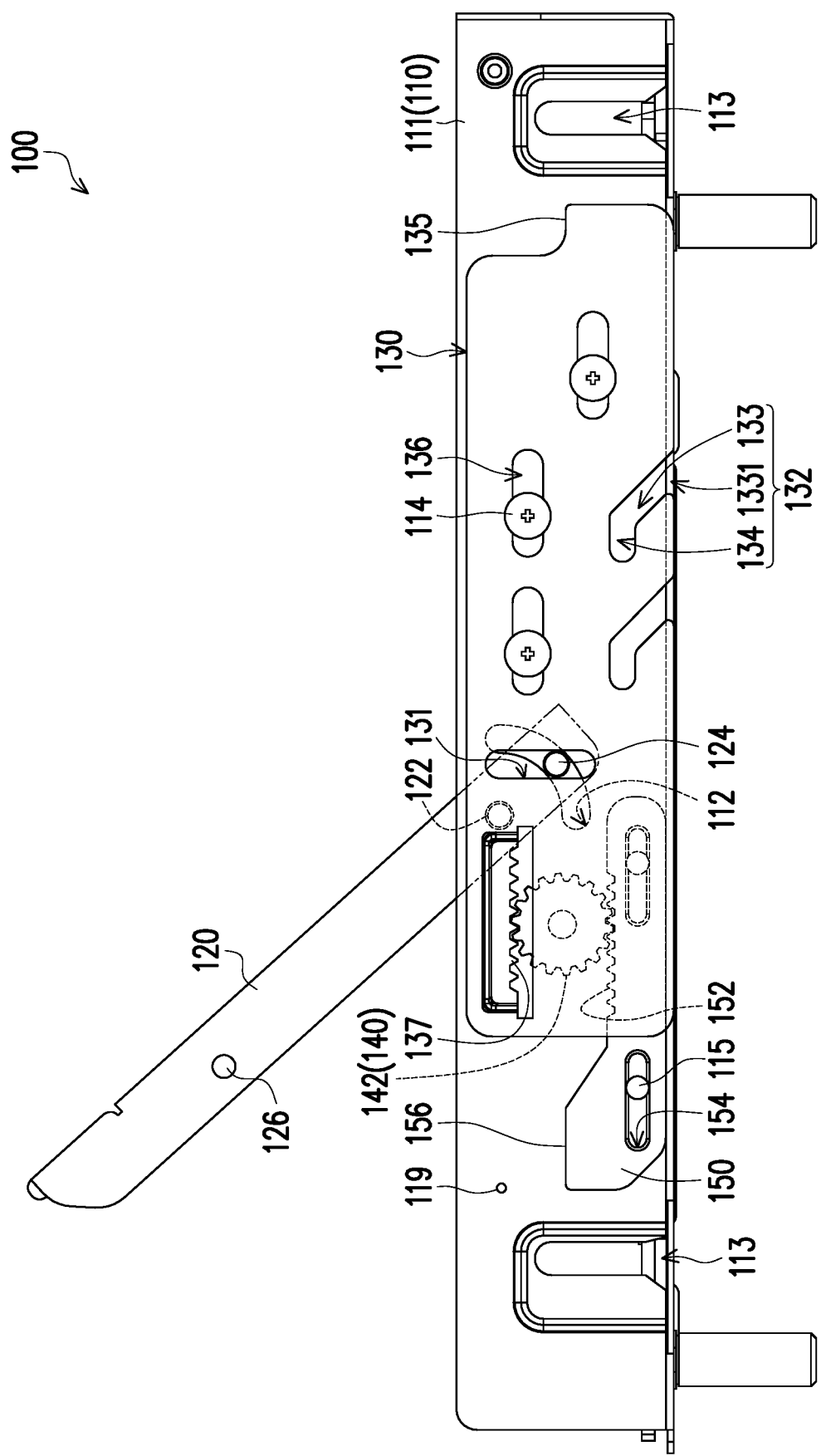
Figure 2E:
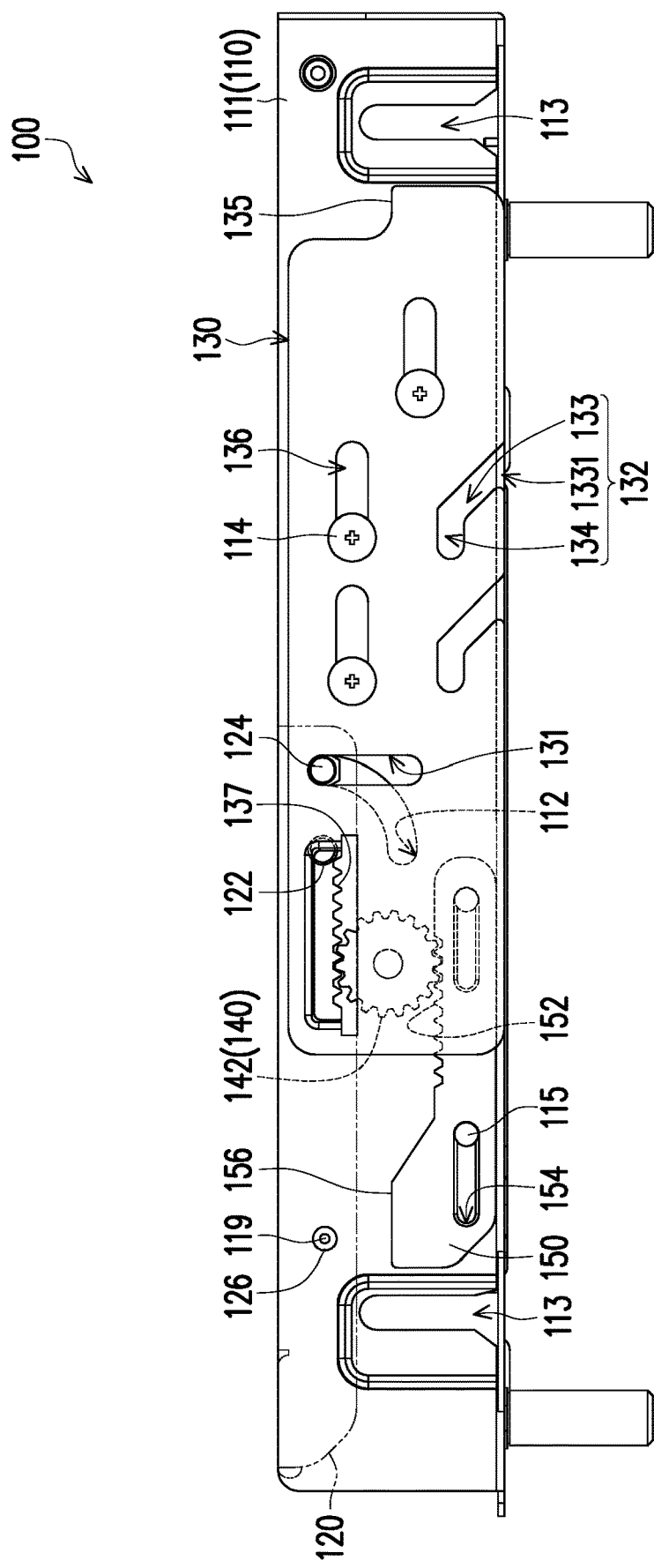

FIGS. 2C to 2E are side views of the handle of the tray of FIG. 2A rotating from vertical to horizontal. First referring to FIG. 2C, when the handle 120 of the tray 100 is vertical, the handle guide post 124 is located at an end of the through slot 112 of the side wall 111 close to the bottom wall 116, and is disposed at an end of the first groove 131 of the first sliding piece 130 close to the bottom wall 116. At this time, the pivot member 122 of the handle 120 is only exposed to the first groove 131 of the first sliding piece 130, but does not interfere with the first sliding piece 130. Further, in this state, the first tray body guide post 114 of the side wall 111 is located at the end of the third groove 136 of the first sliding piece 130 away from the pivot member 122 of the handle 120, and the second tray body guide post 115 of the side wall 111 is located at the end of the fourth groove 154 of the second sliding piece 150 away from the pivot member 122 of the handle 120.

Next, referring to FIG. 2D, the handle 120 rotates with pivot member 122 as the center of rotation, during the rotation of the handle 120 toward the bottom wall 116 to about 45 degrees, the handle guide post 124 rotates relatively away from the bottom wall 116 with respect to the pivot member 122, and pushes the first sliding piece 130 away from the pivot member 122 of the handle 120 along a second axis A2 direction.

At this time, the handle guide post 124 slides from an end of the through slot 112 of the side wall 111 close to the bottom wall 116 to a middle position of the through slot 112 of the side wall 111. Moreover, the handle guide post 124 pushes the first sliding piece 130 against the wall surface of the first groove 131, such that the first sliding piece 130 moves relative to the side wall 111 away (rightward) from the pivot member 122. The location of the first tray body guide post 114 of the side wall 111 in the third groove 136 moves from the end of the third groove 136 of the first sliding piece 130 away from the pivot member 122 toward the end close to the pivot member 122. Since the moving direction and path of the first sliding piece 130 relative to the side wall 111 are limited to the moving direction and path of the first tray body guide post 114 relative to the third groove 136, the first sliding piece 130 moves only along the second axis A2 relative to the side wall 111, and does not move along the first axis A1 (upward and downward) relative to the side wall 111 in the process.

At the same time, when the first sliding piece 130 moves, the first rack 137 of the first sliding piece 130 drives the gear 142 to rotate, and the gear 142 then drives the second rack 152 of the second sliding piece 150 to move in the opposite direction, such that the first sliding piece 130 and the second sliding piece 150 moves along the second axis A2 in an opposite direction.

At this time, the location of the second tray body guide post 115 of the side wall 111 in the fourth groove 154 moves from the end of the fourth groove 154 of the second sliding piece 150 away from the pivot member 122 to the end close to the pivot member 122. Since the moving direction and path of the second sliding piece 150 relative to the side wall 111 are limited to the moving direction and path of the second tray body guide post 115 relative to the fourth groove 154, at this stage the second sliding piece 150 relative to the side wall 111 moves away (leftward) from the pivot member 122 of the handle 120 only along the second axis A2.

With reference to FIG. 2E, when the handle 120 is continuously rotated and the handle 120 reaches the horizontal state, the handle guide post 124 slides upward from a middle position of the through slot 112 of the side wall 111 to the end away from the bottom wall 116. During this process, the handle guide post 124 continues to push the first sliding piece 130 on the wall surface of the first groove 131, such that the first sliding piece 130 continues to move away (rightward) from the pivot member 122 of the handle 120 along the second axis A2 direction relative to the side wall 111.

The first rack 137 of the first sliding piece 130 continues to drive the gear 142 to rotate, such that the second sliding piece 150 continues to move along the second axis A2 and opposite to the moving direction of the first sliding piece 130 (leftward). Finally, the first tray body guide post 114 of the side wall 111 is adjacent to the end of the third groove 136 of the first sliding piece 130 close to the pivot member 122, and the second tray body guide post 115 of the side wall 111 is adjacent to the end of the fourth groove 154 of the second sliding piece 150 close to the pivot member 122.

It may be seen from the above that when the handle 120 is in the vertical state, the handle guide post 124 of the handle 120 is located at the end (lower end) of the through slot 112 close to the lower edge of the first sliding piece 130. When the handle 120 is in the horizontal state, the handle guide post 124 of the handle 120 is located at the other end (upper end) of the through slot 112 away from the lower edge of the first sliding piece 130. Moreover, during the rotation of the handle 120 from the vertical state to the horizontal state relative to the tray body 110, the handle guide post 124 pushes the first sliding piece 130 to move along the second axis A2 relative to the tray body 110, and the second sliding piece 150 is driven by the connecting element 140 to move in the direction opposite to the movement of the first sliding piece 130.

The following will continue to introduce how to fix the tray 100 to the chassis 20 through the rotation of the handle 120 when the tray 100 of the present embodiment is assembled to the chassis 20. For the movement of the tray 100 when it rotates from a vertical state to a horizontal state, no further details will be given. The following mainly describes the relative relationship between the tray 100 and the chassis 20.

Figure 3A:
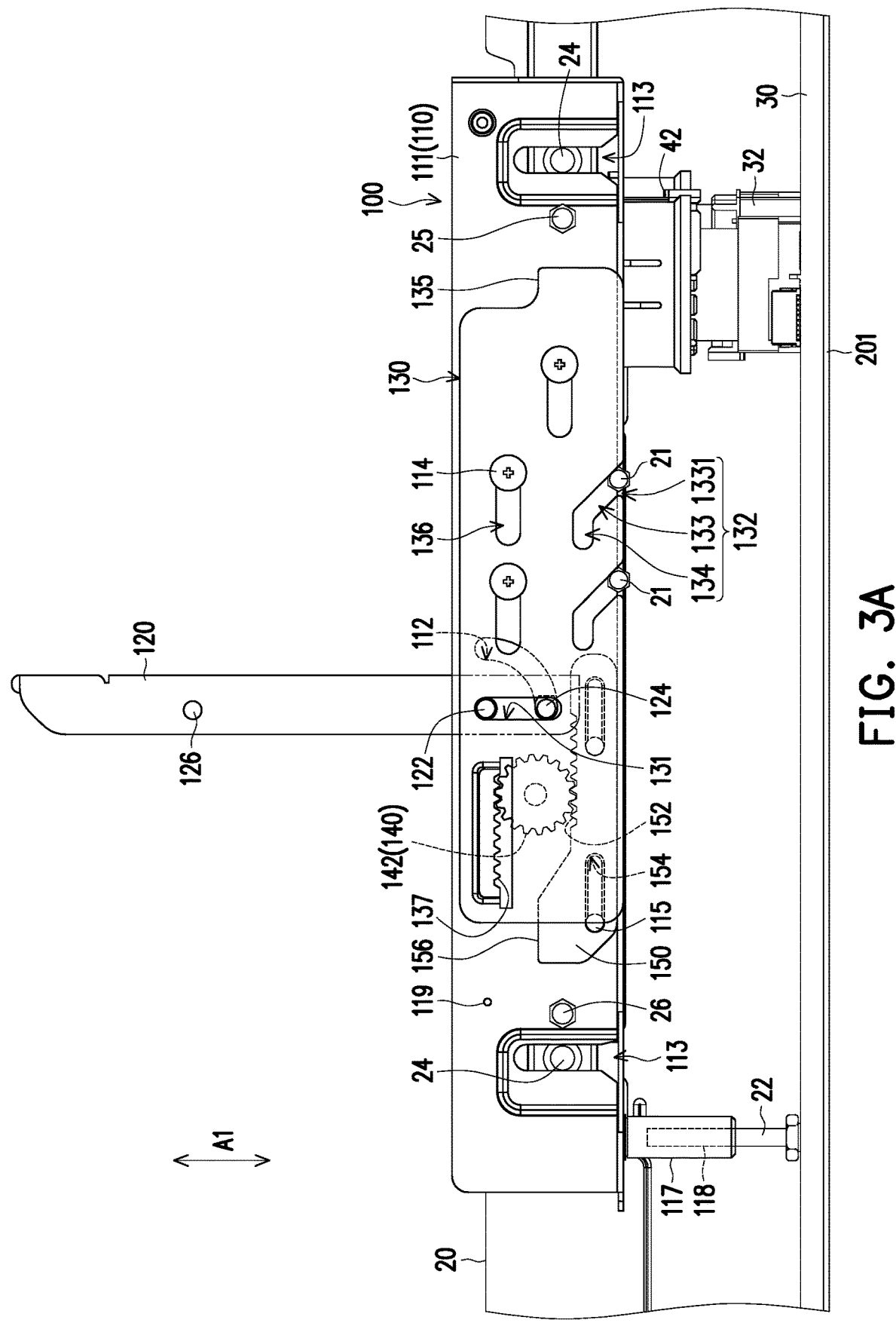
FIG. 3A is a side view of the tray of FIG. 1A disposed in the chassis with the handle in a vertical state.

FIG. 3A is a side view of the tray of FIG. 1A disposed in the chassis with the handle in a vertical state. With reference to FIG. 3A, the tray 100 is detachably disposed in the chassis 20 along the first axis A1. Specifically, the chassis 20 includes at least one first chassis guide post 21 on the side and at least one second chassis guide post 24. When the tray 100 moves (downward) along the first axis A1 toward a bottom surface 201 of the chassis 20 and is disposed in the chassis 20 and the handle 120 is in the vertical state, the first chassis guide post 21 is disposed in the opening 1331 of the second groove 132, enters a part of the inclined section 133 of the second groove 132 close to the lower edge from the opening 1331, and abuts against the inner wall of the second groove 132 in the inclined section 133, such that temporarily, the tray 100 relative to the chassis 20 does not move along the first axis A1 toward the bottom surface 201 of the chassis 20 because of gravity. At this time, the second chassis guide post 24 is disposed in the guiding groove 113 of the side wall 111 of the tray 100.

A motherboard 30 may be provided on the bottom surface 201 of the chassis 20, and the motherboard 30 includes a first connector 32. The circuit board 40 (FIG. 1A) may be provided on the tray 100, and a second connector 42 of the circuit board 40 passes downward out of the tray 100. When the tray 100 is disposed in the chassis 20 and the handle 120 is in the vertical state, the second connector 42 of the circuit board 40 is located above the first connector 32 of the motherboard 30, and the two are not connected to each other.

It is worth mentioning that in the present embodiment, there is a double alignment for the tray 100 and the chassis 20, so as to ensure that during the assembly to the tray 100 in the chassis 20, the second connector 42 of the circuit board 40 may be accurately inserted into the first connector 32 of the motherboard 30. In detail, the first alignment is a rough alignment between the second chassis guide post 24 of the chassis 20 and the guiding groove 113 of the side wall 111 of the tray 100.

Figure 3B:
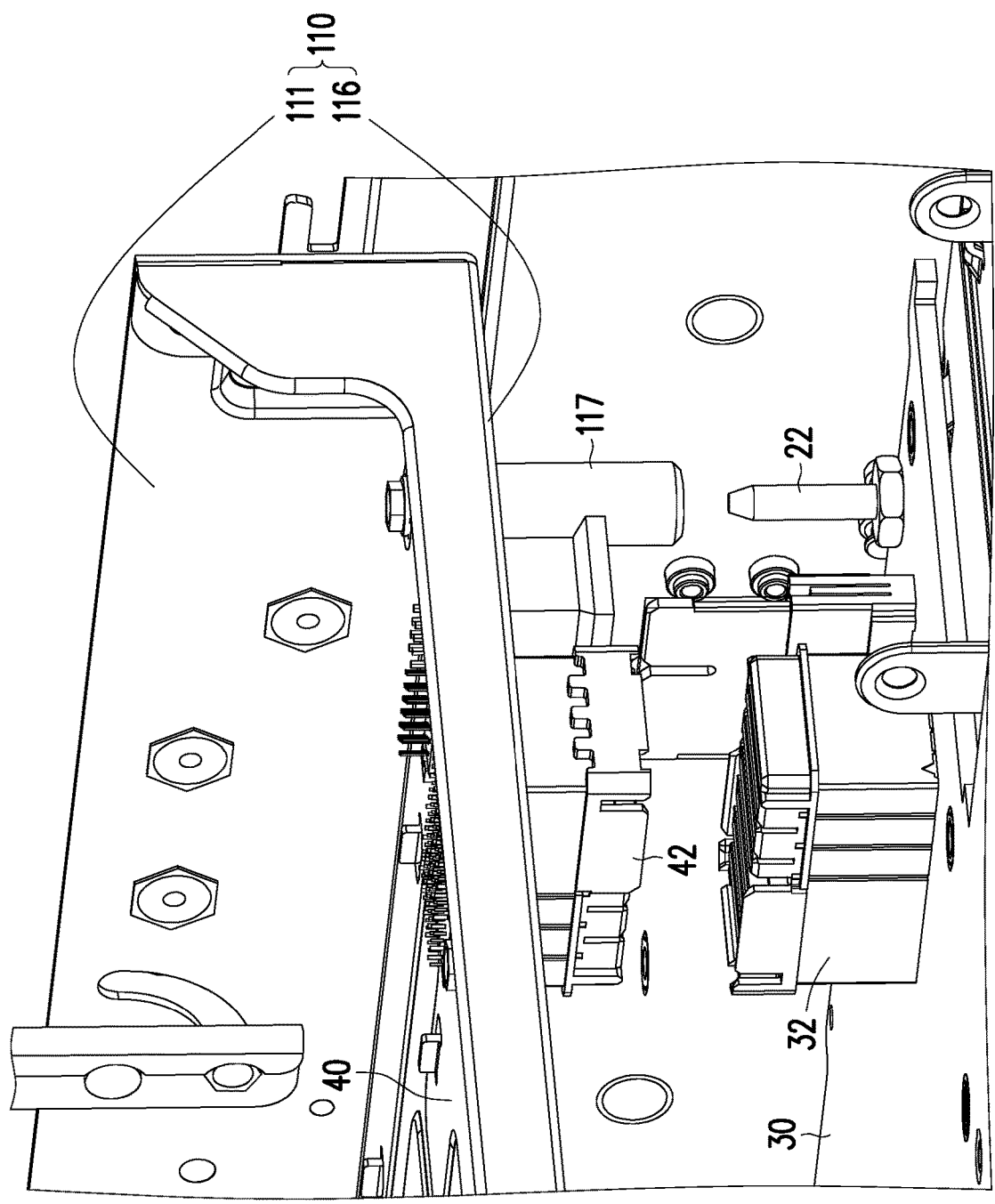
FIG. 3B is a partial three-dimensional schematic view of disposing the tray in the chassis.

FIG. 3B is a partial three-dimensional schematic view of disposing the tray in the chassis. Referring to FIG. 3B, one of the bottom wall 116 and the chassis 20 of the tray 100 includes a positioning column 22, the other includes a positioning slot 118 corresponding to the positioning column 22. The positioning column 22 extends along the first axis A1, and the positioning column 22 may be aligned and engaged with the positioning slot 118. Specifically, in the present embodiment, the chassis 20 includes the positioning column 22 protruding from the bottom surface 201, the bottom wall 116 includes a positioning base 117 protruding below the bottom wall 116, and the positioning base 117 includes the positioning slot 118. The positioning base 117 extends along the first axis A1. Therefore, the second alignment is a fine alignment between the positioning column 22 of the chassis 20 and the positioning slot 118 of the tray 100.

Figure 3C:
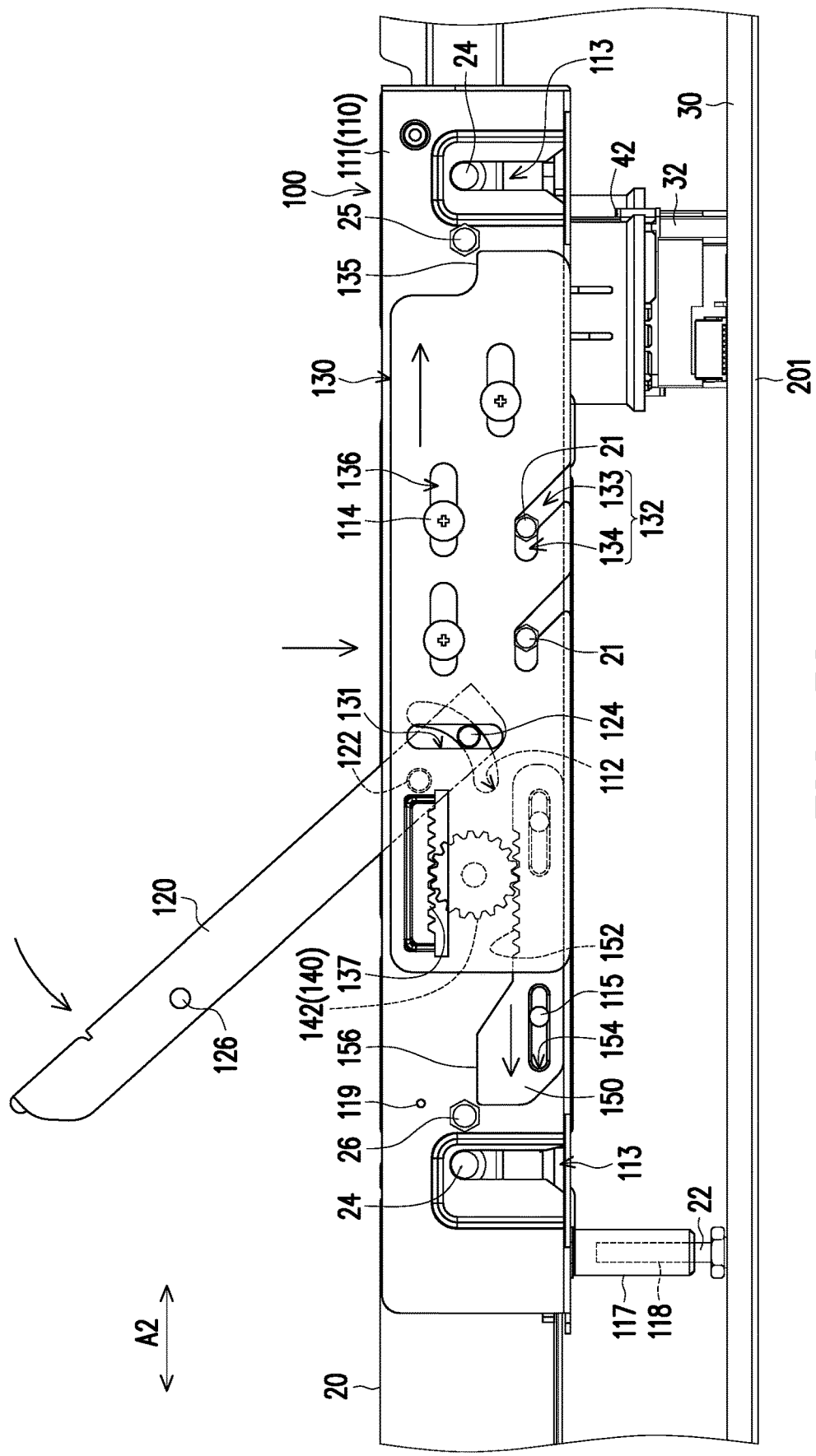
FIG. 3C is a side view of the electronic device of FIG. 3A when the handle is rotated.

FIG. 3C is a side view of the electronic device of FIG. 3A when the handle is rotated. With reference to FIG. 3C, when the handle 120 is rotated to about 45 degrees, the handle guide post 124 pushes the first sliding piece 130 on the wall of the first groove 131, such that the first sliding piece 130 moves relative to the side wall 111 along the second axis A2 away (rightward) from the pivot member 122 of the handle 120.

During the movement of the first sliding piece 130 relative to the side wall 111 of the tray body 110, since one end of the inclined section 133 is close to the pivot member 122 of the handle 120 and away from the bottom wall 116 of the tray 100, and the other end is away from the pivot member 122 of the handle end 120 and close to the bottom wall 116 of the tray 100, when the first sliding piece 130 moves away from the pivot member 122 of the handle 120, the location of the first chassis guide post 21 in the inclined section 113 relatively moves to an end of the inclined section 133 close to the pivot member 122 of the handle 120. Since there is a distance difference between the two ends of the inclined section 133 and the first axis A1, the first sliding piece 130 moves (downward) toward the bottom surface 201 of the chassis 20 and drives the tray body 110 toward the bottom surface 201 of the chassis 20.

Furthermore, since the guiding groove 113 of the side wall 111 of the tray 100 extends along the first axis A1, and the second chassis guide post 24 of the chassis 20 is located in the guiding groove 113 of the side wall 111, it is only possible to move along the first axis A1 between the tray body 110 and the chassis 20. Therefore, during the rotation of the handle 120 from vertical to about 45 degrees, the tray body 110 of the tray 100 moves (downward) to the bottom surface 201 of the chassis 20 along the first axis A1 relative to the chassis 20, such that the second connector 42 of the circuit board 40 is inserted downward into the first connector 32 of the motherboard 30.

Figure 3D:
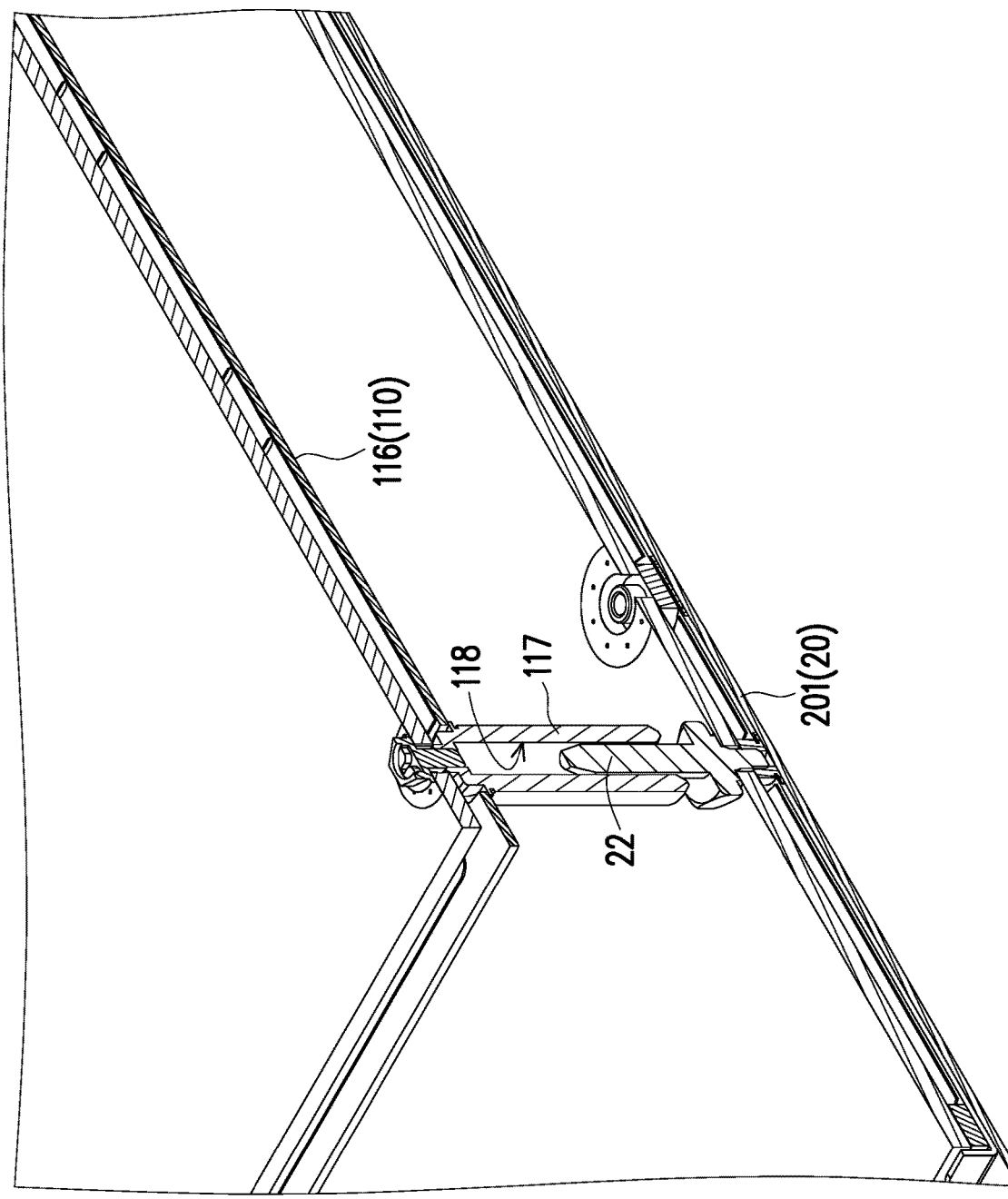
FIG. 3D is a partial perspective schematic view in the state of FIG. 3C.

FIG. 3D is a partial perspective schematic view in the state of FIG. 3C. With reference to FIG. 3D, during the rotation of the handle 120 from vertical to about 45 degrees, the positioning column 22 of the chassis 20 continues to extend into the positioning slot 118 of the positioning base 117 of the tray body 110, so as to accurately guide the tray body 110 (downward) toward the bottom surface 201 of the chassis 20.

Figure 3E:
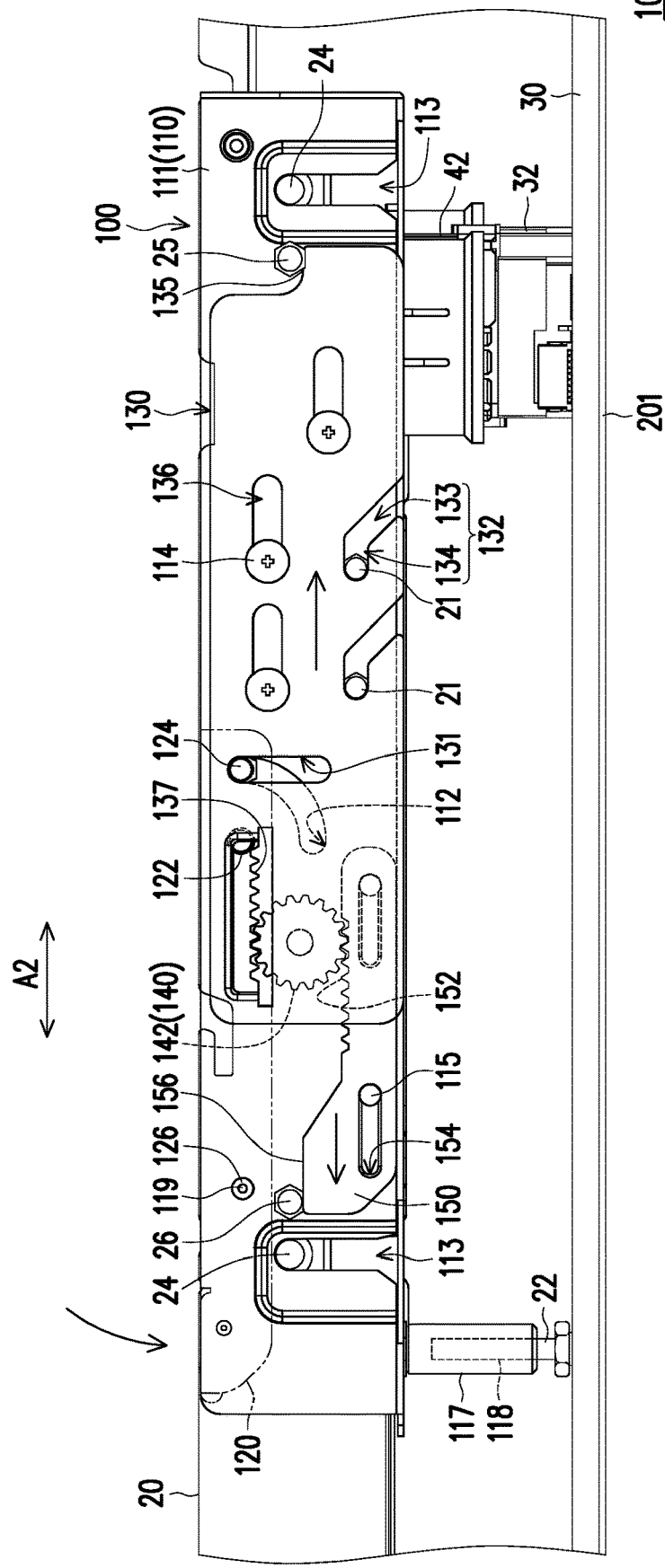
FIG. 3E is a side view of the electronic device of FIG. 3A when the handle is horizontal.

FIG. 3E is a side view of the electronic device of FIG. 3A when the handle is horizontal. With reference to FIG. 3E, the handle 120 is continuously rotated from 45 degrees to the horizontal state. During this process, the movement of first sliding piece 130 makes the first chassis guide post 21 move along the horizontal section 134 (parallel to the second axis A2) of the second groove 132. Therefore, the tray 100 does not move along the first axis A1 relative to the chassis 20 (in the stages of FIG. 3C to FIG. 3E, the tray 100 does not move downward relative to the chassis 20).

The first sliding piece 130 and the second sliding piece 150 continue to move in opposite directions away from each other. In the present embodiment, the first sliding piece 130 includes a first abutting element 135, and the second sliding piece 150 includes a second abutting element 156. The first abutting element 135 and the second abutting element 156 may be, for example, two abutting surfaces. The chassis 20 includes a first positioning member 25 and a second positioning member 26. The first positioning member 25 and the second positioning member 26 may be, for example, two protrusions or two rivets.

When the handle 120 is horizontal, the first chassis guide post 21 is located at an end of the horizontal section 134 close to the handle 120 of the pivot member 122. The first abutting element 135 of the first sliding piece 130 and the second abutting element 156 of the second sliding piece 150 abut under the first positioning member 25 and the second positioning member 26 of the chassis 20, respectively. That is to say, the first positioning member 25 and the second positioning member 26 of the chassis 20 serve as stoppers for preventing the first sliding piece 130 and the second sliding piece 150 of the tray 100 from being separated from the chassis 20. Therefore, when the handle 120 is horizontal, the tray 100 may not directly separated from the chassis 20.

Figure 3F:
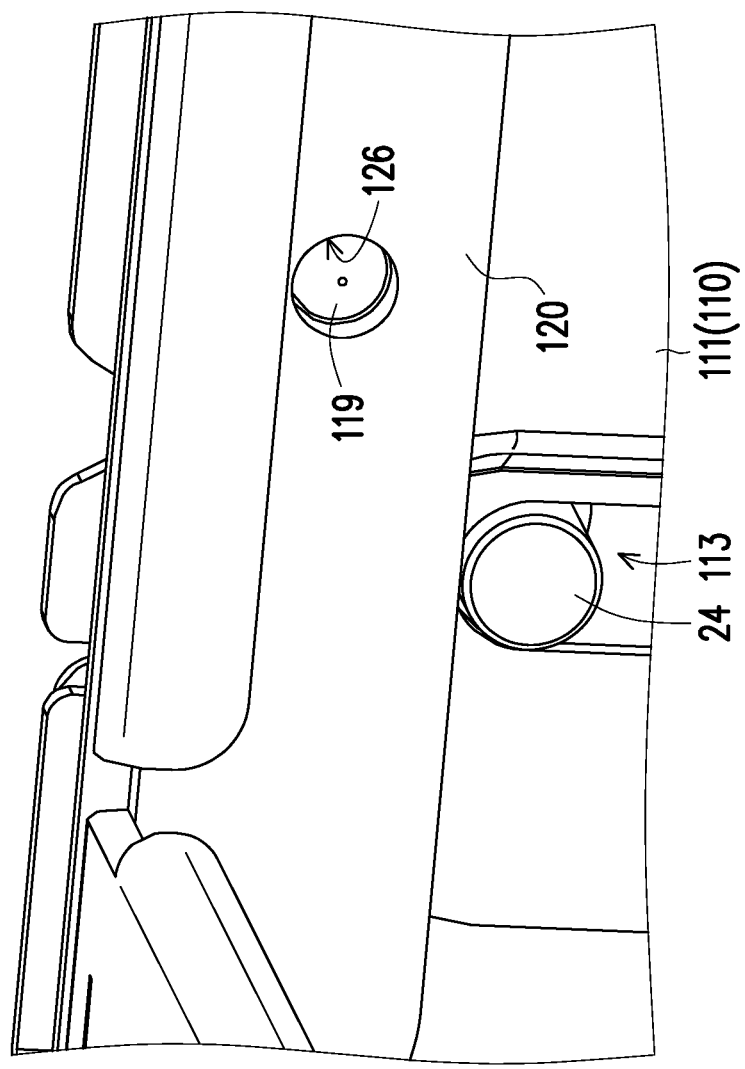
FIG. 3F is a partial perspective schematic view in the state of FIG. 3E.

FIG. 3F is a partial perspective schematic view in the state of FIG. 3E. With reference to FIG. 3F, in the present embodiment, one of the handle 120 and the side wall 111 includes a bump 119, and the other includes the locking hole 126 corresponding to the bump 119. Specifically, the handle 120 includes a locking hole 126, and the side wall 111 of the tray body 110 includes the bump 119. When the handle 120 is rotated horizontally, the bump 119 of the side wall 111 of the tray body 110 enters the locking hole 126 of the handle 120, such that the handle 120 is positioned on the side wall 111 of the tray body 110.

Furthermore, it may be seen from FIGS. 3C, 3E, and 3F that the second chassis guide post 24 of the chassis 20 abuts against a top of the guiding groove 113 of the side wall 111 of the tray body 110. In other words, besides guiding, the second chassis guide post 24 of the chassis 20 also supports the tray 100.

It is worth mentioning that, as shown in FIG. 2B, in the present embodiment, the distance L2 (force arm) between the operating end 121 and the handle 120 is greater than the distance L1 (force arm) between handle the guide post 124 and the handle 120. The user only needs to exert a little force to make the handle guide post 124 push the first sliding piece 130, so the overall process is quite labor-saving. Moreover, the tray 100 can be easily assembled to, disassembled from, and fixed to the chassis 20 accordingly, which greatly saves the time required to fix the tray with screws.

To move the tray 100 out of the chassis 20, by rotating the handle 120 from the horizontal state to the vertical state in the order as shown in FIG. 3E, FIG. 3C, and FIG. 3A, the tray 100 can be moved upward relative to the chassis 20, and the second connector 42 of the circuit board 40 can be pulled out of the first connector 32 of the motherboard 30.

Another form of the tray 100a is introduced below. The elements of the tray 100a that are the same as or similar to those of the tray 100 in FIGS. 2A to 2E are represented by the same or similar reference numerals, and descriptions will not be repeated. Only the main differences will be described.

Figure 4A:
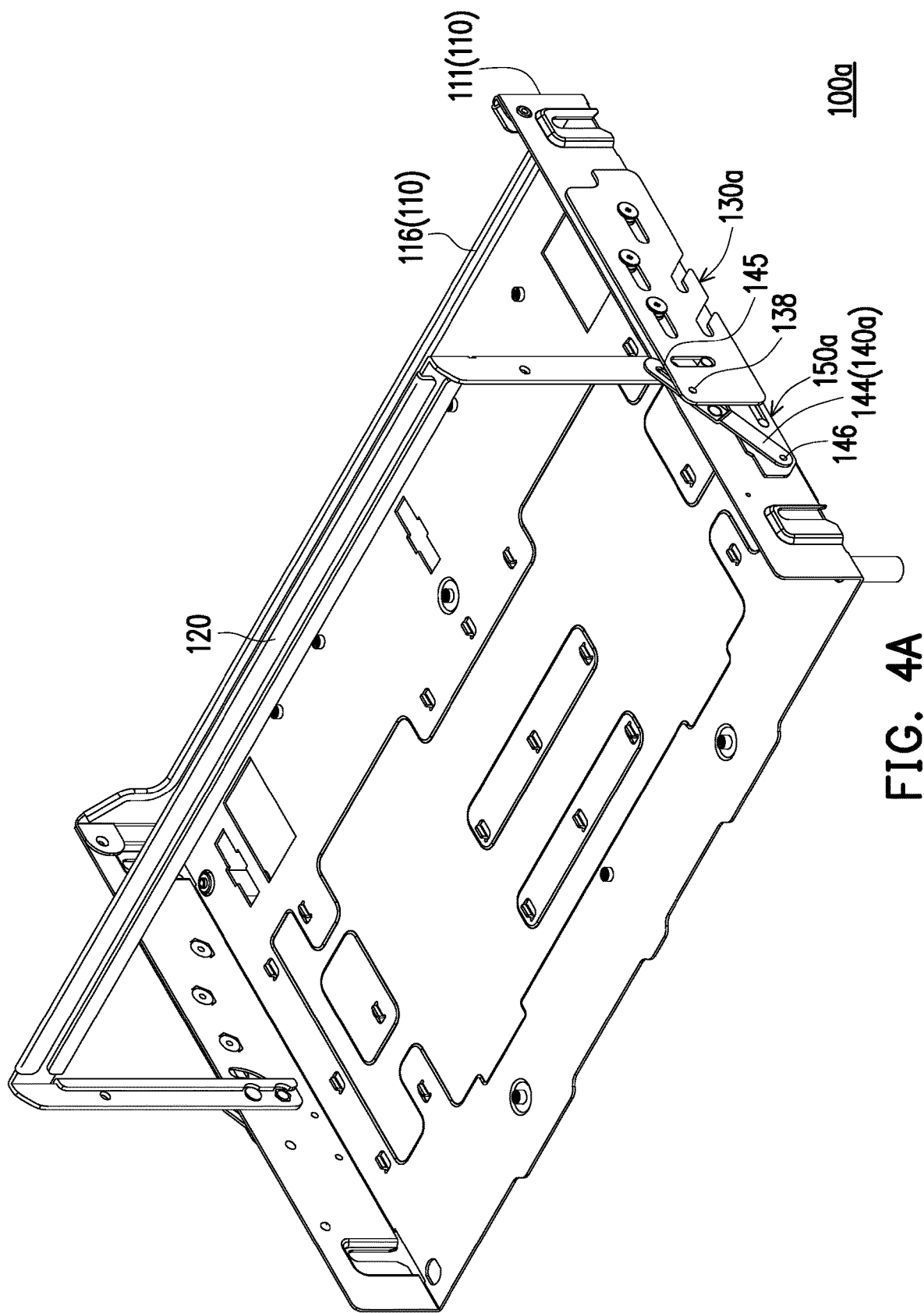
FIG. 4A is a three-dimensional schematic view of a tray according to another embodiment of the disclosure.
Figure 4B:
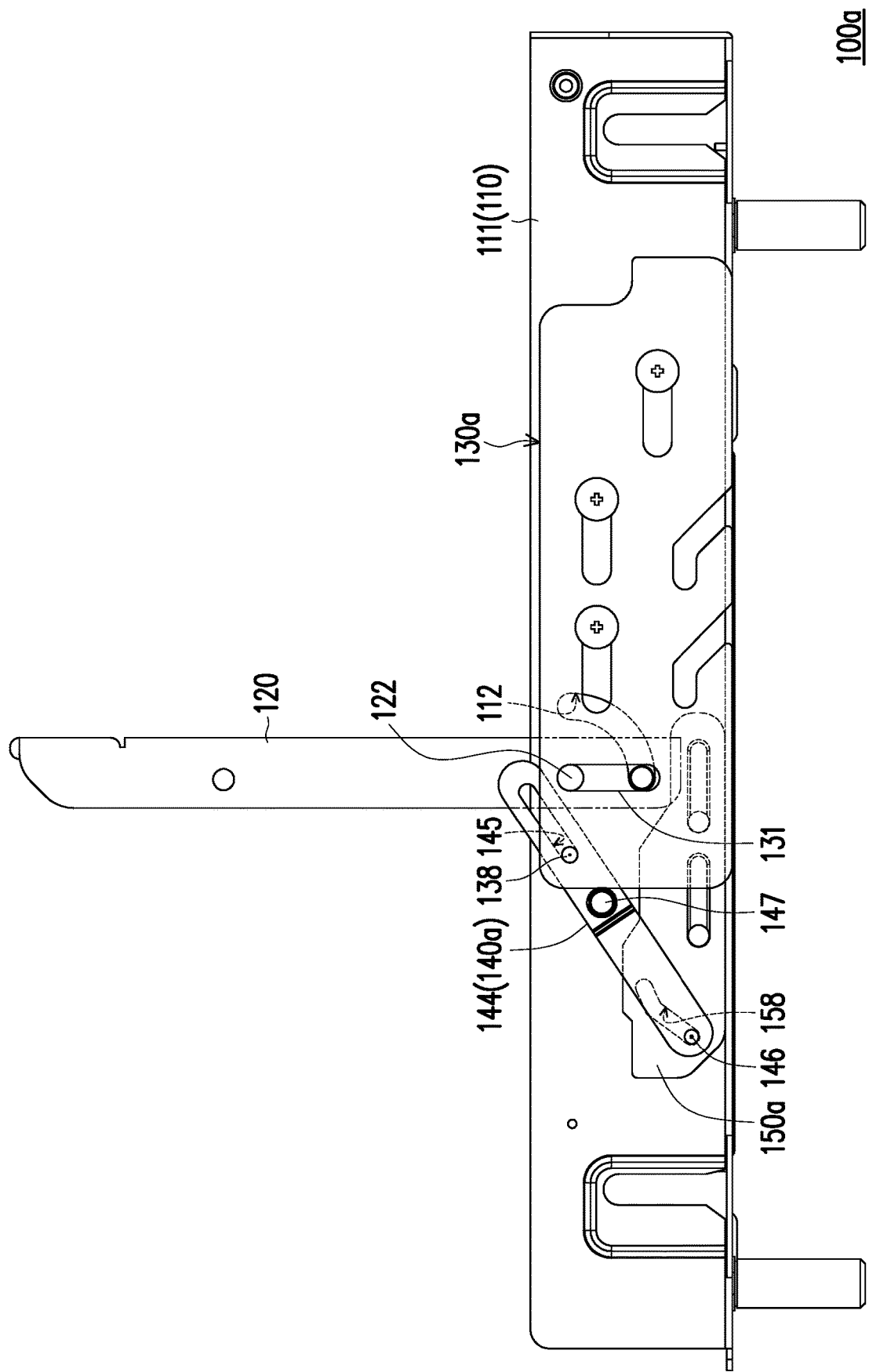
FIGS. 4B to 4D are side views of the handle of the tray of FIG. 4A rotated from vertical to horizontal.
Figure 4C:
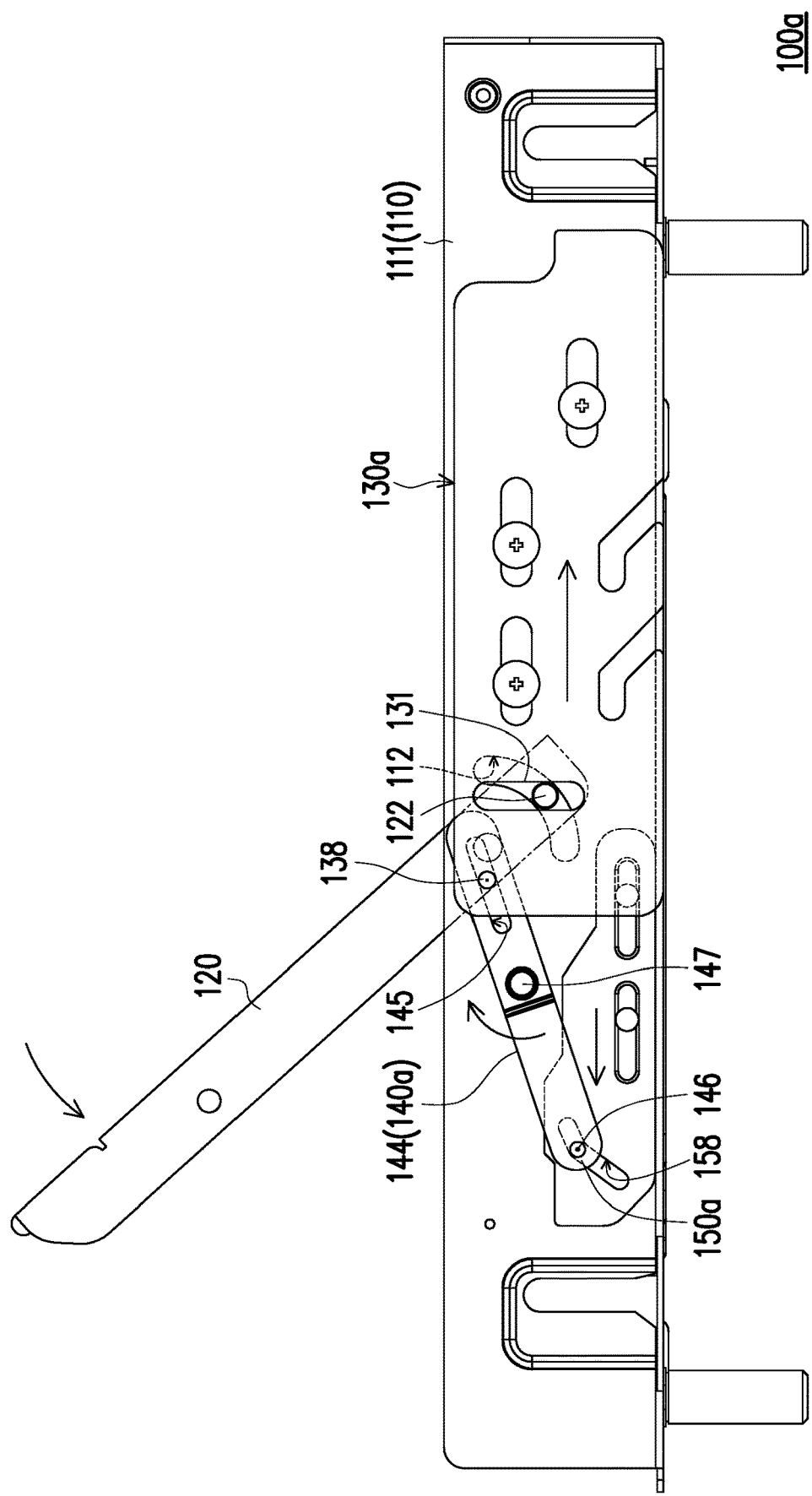
Figure 4D:
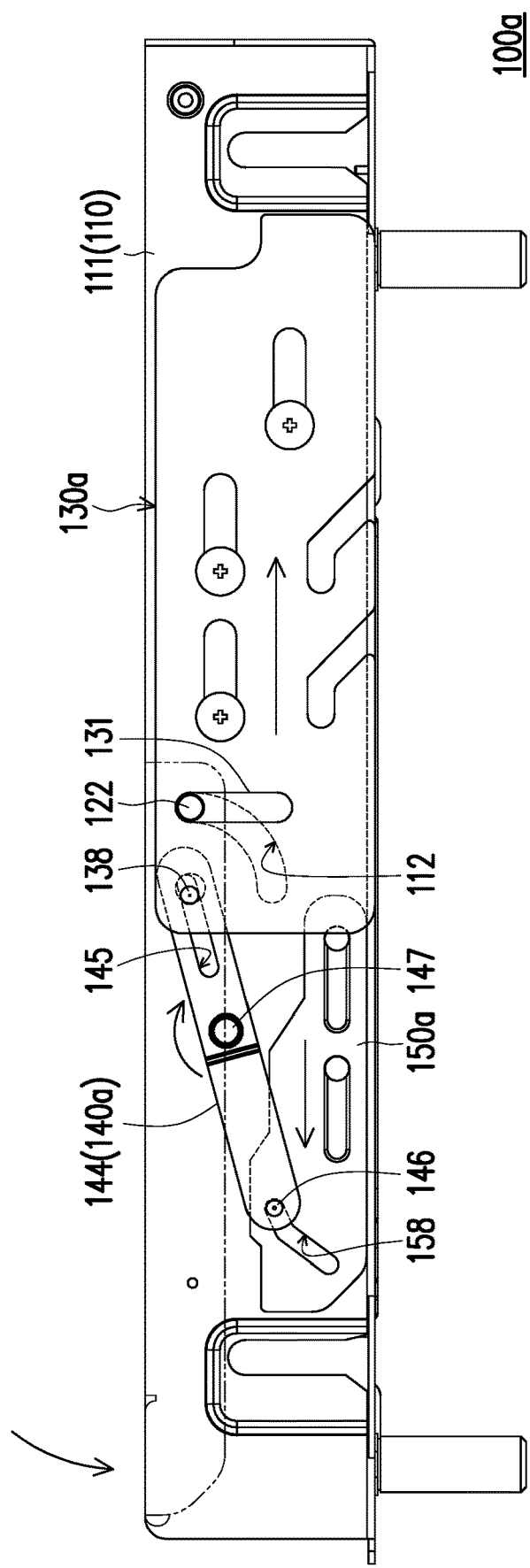

FIG. 4A is a three-dimensional schematic view of a tray according to another embodiment of the disclosure. FIGS. 4B to 4D are side views of the handle of the tray of FIG. 4A rotated from vertical to horizontal. First referring to FIGS. 4A and 4B, the main difference between the tray 100a of the present embodiment and the tray 100 of FIG. 2A is that the type of a connecting element 140a is different from the way a first sliding piece 130a drives a second sliding piece 150a.

Specifically, in the present embodiment, the connecting element 140a includes a connecting rod 144. As shown in FIG. 4B, the connecting rod 144 includes a pivot 147, a connecting rod groove 145, and a connecting rod guide post 146. The connecting rod 144 is pivotally connected to the side wall 111 of the tray body 110 through the pivot 147, and the connecting rod groove 145 and the connecting rod guide post 146 are respectively provided at two ends of the pivot 147. In the present embodiment, the connecting rod groove 145 is provided at the end of the connecting rod 144 close to the pivot member 122 of the handle 120, and the connecting rod guide post 146 is provided at the end of the connecting rod 144 away from the pivot member 122 of the handle 120.

The first sliding piece 130a includes a sliding piece guide post 138 disposed in the connecting rod groove 145, the second sliding piece 150a includes a fifth groove 158, and the connecting rod guide post 146 disposed in the fifth groove 158. One end of the fifth groove 158 is close to the pivot member 122 of the handle 120 and away from the bottom wall 116 of the tray 100, and the other end is away from the pivot member 122 of the handle end 120 and close to the bottom wall 116 of the tray 100. The two ends of the fifth groove 158 have a distance difference from the first axis A1.

It may be seen in FIG. 4B that when the handle 120 is in the vertical state, the sliding piece guide post 138 of the first sliding piece 130a is located at the end (left end) of the connecting rod groove 145 of the connecting rod 144 away from the pivot member 122 of the handle 120, and the connecting rod guide post 146 is located at the end (left end) of the fifth groove 158 of the second sliding piece 150a away from the pivot member 122 of the handle 120.

With reference to FIG. 4C, during the rotation of the handle 120 to about 45 degrees toward the bottom wall 116 of the tray 100a, the handle guide post 124 slides upward from the through slot 112 of the side wall 111 close to the bottom wall 116 to the middle part of the through slot 112 of the side wall 111, and pushes the first sliding piece 130a on the wall surface of the first groove 131, such that the first sliding piece 130a moves relative to the side wall 111. At this time, the sliding piece guide post 138 of the first sliding piece 130a moves away (rightward) from the handle 120 of the pivot member 122. At this time, the sliding piece guide post 138 is located at the middle part of the connecting rod groove 145 of the connecting rod 144.

Comparing FIG. 4B with FIG. 4C, it may be seen that the sliding piece guide post 138 of the first sliding piece 130a is pushed against the wall surface of the connecting rod groove 145 of the connecting rod 144, such that the connecting rod 144 rotates in a direction opposite to the rotation of the handle. As a result, the connecting rod guide post 146 is driven to be pushed against the wall surface of the fifth groove 158 of the second sliding piece 150a, and moves to the middle part of the fifth groove 158, such that the second sliding piece 150a moves away (leftward) from the pivot of the pivot member 122 of the handle 120.

Next, referring to FIG. 4D, during continuous rotation of the handle 120 such that the handle 120 is in a horizontal state, the first sliding piece 130a and the second sliding piece 150a continue to move away from each other along the second axis A2. Finally, the sliding piece guide post 138 of the first sliding piece 130a moves to the end (right end) of the connecting rod groove 145 of the connecting rod 144 close to the handle 120 pivot member 122, and the connecting rod guide post 146 moves to the end (right end) of the fifth groove 158 of the second sliding piece 150a close to the handle 120 pivot member 122.

Similarly, when the tray 100a of the present embodiment is assembled to the chassis 20 shown in FIG. 1A, the effects of labor-saving, quick and easy disassembly and assembly can also be achieved. Of course, the type of connecting element 140a and the manner in which the first sliding piece 130a drives the second sliding piece 150a are not limited thereto.

In summary, the first sliding piece of the tray of the disclosure is movably disposed on the side wall of the tray body, the handle is pivotally connected to the side wall of the tray body, and the handle guide post is disposed in the through slot of the tray body and the first groove of the first sliding piece. Therefore, when the handle rotates relative to the side wall of the tray body, the handle guide post may push the first sliding piece against the wall of the first groove, such that the first sliding piece moves relative to the side wall of the tray body. When the tray is disposed on the chassis, the first chassis guide post is detachably disposed in the second groove. During the movement of the first sliding piece relative to the side wall of the tray body, the inner edge of the second groove is matched with the first chassis guide post, such that the tray is assembled in the chassis along the first axis. Similarly, rotating the handle in the opposite direction may move the tray out of the chassis. Therefore, the tray of the disclosure can be easily assembled to and disassembled from the chassis.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A tray, detachably assembled to a chassis, the chassis comprising a first chassis guide post, and the tray comprising:
   a tray body, comprising a side wall and a through slot disposed on the side wall;
   a handle, pivotally connected to the side wall and comprising a handle guide post;
   a first sliding piece, movably disposed on the side wall and comprising a first groove and a second groove;
   a connecting element, pivoted on the side wall; and
   a second sliding piece, movably disposed on the side wall, and the connecting element disposed between the first sliding piece and the second sliding piece, such that the first sliding piece is connected with the second sliding piece;
   wherein the handle guide post is disposed in the through slot and the first groove, and the first chassis guide post is detachably disposed in the second groove.

2. The tray as described in claim 1, wherein the first groove of the first sliding piece extends along a first axis; the second groove comprises a horizontal section extending along a second axis, an inclined section extending from a lower edge of the first sliding piece, and an opening; and the opening is provided at a lower edge of the first sliding piece at the inclined section, wherein the inclined section has a distance difference in a first axis direction.

3. The tray as described in claim 2, wherein the first sliding piece comprises a first abutting element, and the chassis comprises a first positioning member; the first abutting element is configured to abut against the first positioning member of the chassis.

4. The tray as described in claim 1, wherein the tray body comprises a first tray body guide post protruding from the side wall, the first sliding piece comprises a third groove, and the first tray body guide post is sleeved in the third groove, such that the first sliding piece is movably disposed on the side wall.

5. The tray as described in claim 1, wherein the connecting element comprises a gear, the first sliding piece comprises a first rack, the second sliding piece comprises a second rack, and the gear is engaged with the first rack and the second rack.

6. The tray as described in claim 1, wherein the connecting element comprises a connecting rod, and the connecting rod comprises a connecting rod groove and a connecting rod guide post; the first sliding piece comprises a sliding piece guide post disposed in the connecting rod groove, the second sliding piece comprises a fifth groove, and the connecting rod guide post is disposed in the fifth groove.

7. The tray as described in claim 1, wherein the tray body comprises a second tray body guide post protruding from the side wall, the second sliding piece comprises a fourth groove, and the second tray body guide post is sleeved in the fourth groove, such that the second sliding piece is movably disposed on the side wall.

8. The tray as described in claim 1, wherein the first sliding piece comprises a first abutting element, the second sliding piece comprises a second abutting element, and the chassis comprises a first positioning member and a second positioning member; the first abutting element and the second abutting element are configured to abut against the first positioning member and the second positioning member of the chassis, respectively.

9. The electronic device as described in claim 1, wherein one of the handle and the side wall comprises a bump, and the other of the handle and the side wall comprises a locking hole corresponding to the bump.

10. An electronic device, comprising:
    a chassis, comprising a first chassis guide post; and
    a tray, detachably disposed in the chassis, comprising:
      a tray body, comprising a side wall and a through slot disposed on the side wall;
      a handle, pivotally connected to the side wall and comprising a handle guide post;
      a first sliding piece, movably disposed on the side wall and comprising a first groove and a second groove;
      a connecting element, pivoted on the side wall; and
      a second sliding piece, movably disposed on the side wall, wherein the connecting element is disposed between the first sliding piece and the second sliding piece, such that the first sliding piece is connected with the second sliding piece;
      wherein the handle guide post is disposed in the through slot and the first groove, and the first chassis guide post is detachably disposed in the second groove.

11. The electronic device as described in claim 10, wherein the chassis comprises a second chassis guide post, the tray comprises a guiding groove protruding from the side wall, and the second chassis guide post is sleeved in the guiding groove.

12. The electronic device as described in claim 10, wherein the tray comprises a bottom wall, one of the bottom wall and the chassis comprises a positioning column, and the other of the bottom wall and the chassis comprises a positioning slot corresponding to the positioning column.

13. The tray as described in claim 10, wherein the first groove of the first sliding piece extends along a first axis; the second groove comprises a horizontal section extending along a second axis, an inclined section extending from a lower edge of the first sliding piece, and an opening; and the opening is provided at the lower edge of the first sliding piece at the inclined section, wherein the inclined section has a distance difference in a first axis direction.

14. The electronic device as described in claim 13, wherein the first sliding piece comprises a first abutting element, the chassis comprises a first positioning member; the first abutting element is configured to abut against the first positioning member of the chassis.

15. The electronic device as described in claim 10, wherein the tray body comprises a first tray body guide post protruding from the side wall, the first sliding piece comprises a third groove, and the first tray body guide post is sleeved in the third groove, such that the first sliding piece is movably disposed on the side wall.

16. The electronic device as described in claim 10, wherein the connecting element comprises a gear, the first sliding piece comprises a first rack, the second sliding piece comprises a second rack, and the gear is engaged with the first rack and the second rack.

17. The electronic device as described in claim 10, wherein the connecting element comprises a connecting rod, the connecting rod comprises a connecting rod groove and a connecting rod guide post; the first sliding piece comprises a sliding piece guide post disposed in the connecting rod groove, the second sliding piece comprises a fifth groove, and the connecting rod guide post is disposed in the fifth groove.

18. The electronic device as described in claim 10, wherein the tray body comprises a second tray body guide post protruding from the side wall, the second sliding piece comprises a fourth groove, and the second tray body guide post extends into the fourth groove, such that the second sliding piece is movably disposed on the side wall.

19. The electronic device as described in claim 10, wherein the first sliding piece comprises a first abutting element, the second sliding piece comprises a second abutting element, and the chassis comprises a first positioning member and a second positioning member; the first abutting element and the second abutting element are configured to abut under the first positioning member and the second positioning member of the chassis, respectively.

20. The electronic device as described in claim 10, wherein one of the handle and the side wall comprises a bump, and the other of the handle and the side wall comprises a locking hole corresponding to the bump.

* * * * *